United States Patent

Windischmann et al.

Patent Number: 5,190,631
Date of Patent: Mar. 2, 1993

[54] PROCESS FOR FORMING TRANSPARENT SILICON CARBIDE FILMS

[75] Inventors: Henry Windischmann, Solon; George Fischer, Shaker Heights, both of Ohio

[73] Assignee: The Carborundum Company, Niagara Falls, N.Y.

[21] Appl. No.: 898,171

[22] Filed: Jun. 12, 1992

Related U.S. Application Data

[63] Continuation of Ser. No. 638,939, Jan. 9, 1991, abandoned.

[51] Int. Cl.⁵ .............................. C23C 14/34
[52] U.S. Cl. ..................... 204/192.15; 204/192.14; 204/192.16; 204/192.23
[58] Field of Search ............... 204/192.15, 192.22, 204/192.23, 192.16, 192.26, 192.14

[56] References Cited

U.S. PATENT DOCUMENTS

| | | | |
|---|---|---|---|
| 4,209,375 | 6/1980 | Gates et al. | 204/192.16 |
| 4,359,372 | 11/1982 | Nagai et al. | 204/192.23 X |
| 4,411,963 | 10/1983 | Aine | 204/192.16 X |
| 4,661,420 | 4/1987 | Nakamura et al. | 428/692 |
| 4,737,252 | 4/1988 | Hoffman | 204/192.16 |
| 4,759,836 | 7/1988 | Hill et al. | 204/192.21 |
| 4,917,970 | 4/1990 | Funkunbusch | 365/122 X |
| 4,936,959 | 6/1990 | Schmatz et al. | 204/192.23 X |
| 4,971,673 | 11/1990 | Weisweiler et al. | 204/192.23 X |

FOREIGN PATENT DOCUMENTS

144055 6/1985 European Pat. Off. ........ 204/192.23

Primary Examiner—Nam X. Nguyen
Attorney, Agent, or Firm—Larry W. Evans; David J. Untener; Scott A. McCollister

[57] ABSTRACT

A process for forming a transparent silicon carbide film on substrates by magnetron sputtering a silicon carbide target in a partial vacuum having a partial pressure of hydrogen and argon.

9 Claims, No Drawings

PROCESS FOR FORMING TRANSPARENT SILICON CARBIDE FILMS

This is a continuation of co-pending application Ser. No. 07/638,939 filed Jan. 9, 1991, abandoned.

BACKGROUND OF THE INVENTION

This invention relates to silicon carbide films/coatings and a process for preparing them. Particularly, the process involves depositing a layer of silicon carbide by a sputtering process using an electrically conductive silicon carbide target in an atmosphere having a low partial pressure of an inert gas and hydrogen. The coatings formed by the process of the present invention are particularly well suited for use as protective coatings on substrates which require a transparent coating.

Previously, silicon carbide thin-film layers have been deposited on the surface of a substrate to provide abrasion and chemical resistance. To be effective, the silicon carbide layers must offer chemical and physical resistance to degradation by heat, humidity, and a variety of chemicals, but transparency is also necessary for certain uses such as coating glass or optical recording medium.

U.S. Pat. No. 4,917,970 discloses a process for forming thin SiC films which are sufficiently transparent to be used in protecting a magneto optic recording medium. Nonreactive (i.e., no reactive gases present) direct current (DC) magnetron sputtering was used because it offered superior results when compared to evaporation techniques.

Although the coating of U.S. Pat. No. 4,917,970 is sufficiently transparent for laser read optical discs, it is desirable in the art to achieve a sputtered silicon carbide coating with a higher degree of transparency to allow thicker more protective coatings without a substantial loss of transparency.

SUMMARY OF THE INVENTION

Accordingly, it is a primary objective of this invention to provide a new and improved process for forming silicon carbide coatings.

It is a further objective of this invention to provide a new and improved process for forming transparent silicon carbide coatings.

Additional objects and advantages of the invention will be set forth in part in the description which follows and in part will be obvious from the description, or may be learned by practice of the invention. The objects and advantages of the invention may be realized and achieved by means of the instrumentalities and combinations particularly pointed out in the appended claims.

To achieve the foregoing objects in accordance with the purpose of the invention, as embodied and broadly described herein, the process of this invention comprises sputtering a silicon carbide target in a partial vacuum having a low partial pressure of an inert gas and hydrogen to form a film of silicon carbide on a substrate.

DETAILED DESCRIPTION OF THE INVENTION

While the inventive process will be described in connection with a preferred procedure, it will be understood that it is not intended to limit the invention to that procedure. On the contrary, it is intended to cover all alternatives, modifications and equivalents as may be included within the spirit and scope of the invention defined by the appended claims. The sputtering process consists of bombarding a target material, in a solid state with ions from a gas discharge, so that at the point on the surface of the target where the ions make contact, the atoms of the target are dislodged and these atoms are transported to a substrate where they build up to form a coating.

There are four major elements required for a sputtering system. They include a sputtering chamber which has a vacuum atmosphere; a pumping system to create the vacuum; a target, which in this case is silicon carbide; and a power supply to establish accelerating voltage for electrons and ions. Generally this is an RF or DC power supply. There may also be a plate, often having an anode potential, for holding the substrates.

Sputtering takes place in a low-pressure atmosphere of gas. When nonreactive sputtering is being performed the gas is inert. Argon is preferred because it is inexpensive and produces reasonable yields of sputtered atoms in a momentum transfer process with the target. It is desirable to perform the sputtering at a low gas partial pressure, typically 0.01 torr or less.

It has been discovered that the transparency of a silicon carbide film can be improved by including hydrogen in the low-pressure inert gas atmosphere. More particularly, it is desirable to perform the sputtering process in a partial vacuum having a partial pressure of argon and hydrogen. Preferably, the hydrogen is present in an amount greater than 5% of the total gas content. More preferably, the hydrogen is present in an amount greater than 10%. Most preferably, the hydrogen is present in an amount greater than 20%. The hydrogen may function to form some hydrogenated silicon carbide in the film. Although not wishing to be bound by theory, it is believed that the hydrogen in the plasma gas environment also forms volatile hydrocarbons with excess carbon from the sputtering target. This consumption of the excess carbon prevents a portion of the excess carbon from being assimilated into the silicon carbide film. Excess carbon in the film can reduce its transparency.

The films prepared by this process, possess excellent transparency. A 1.0 micron thick silicon carbide film on a glass substrate will have greater than 50 percent transmission (including the glass). Preferably, the transparency will be above 55 percent. A 0.5 micron thick silicon carbide film on a glass substrate will have greater than 60 percent transparency (including the glass). Preferably, the transparency will be above 65 percent.

Prior to admitting the argon and hydrogen gases to the vacuum chamber, the chamber must be evacuated of background and contaminant gases which would degrade the film. Water, oxygen or nitrogen impurities can cause inferior quality deposits. The most common method of evacuating the chamber is by diffusion and rotary pump. Turbo-molecular pumps and cryogenic pumping are also techniques utilized for evacuating chambers.

The power supply for sputtering may be of any variety known to those of ordinary skill in the art. Preferably, DC (direct current) or RF (radio frequency) power supplies are used. The choice of these two varieties depends on the particular technology applied and on the available equipment. In the use envisioned by this invention DC sputtering is preferred.

Direct current (DC) sputtering offers high deposition rates. Furthermore, there is less electromagnetic interference with the control equipment than is produced by RF methods and the temperatures generated at the substrate are low enough to permit coating of plastic substrates.

If the process is carried out in a strong transverse magnetic field, it is magnetron sputtering. Generally, the magnetic field is applied perpendicular to the electric field in the chamber. Sputtering in the magnetic field reduces the pressures needed to sputter and increases the mean-free-path. This occurs because electrons are deflected into a cycloidal path causing them to travel farther before reaching the anode and increasing the ionization yield per electron, yielding a denser plasma localized at the target surface. Longer mean-free paths result in higher mean energy of arrival of the sputtering ions, and thereby increases the sputtering rate. Because of plasma localization, radiation damage by energetic particles is much less in magnetron sputtering than in other sputtering techniques. Therefore, it can be performed when coating sensitive substrates. Accordingly, a DC-magnetron sputtering process is preferred for depositing the silicon carbide films of the present invention.

DC-magnetron sputtering requires a sputtering target which is electrically conductive. A suitable target for nonreactive DC-magnetron sputtering is electrically conductive silicon carbide, available from The Carborundum Company, Structural Ceramics Division, Niagara Falls. N.Y. under the trade name Hexoloy, the subject of U.S. Pat. No. 4,525,461 incorporated herein by reference. A grade of the material identified by this manufacturer is SG, which is produced by bonding approximately 95% silicon carbide and 5% graphite powder by weight and adding suitable binders. The blended powders are extruded to form a sheet or rod and then sintered in a high-temperature graphite furnace. The final product consists of silicon carbide grains in a matrix of electrically conductive porous graphite. The electrical conductivity at 20° C. is between 0.2 and 300 mho/centimeter, depending upon the doping.

Target shapes in common use are rectangular plates, disks, rings and tubes. Sizes may range from several inches in diameter to several feet in diameter in special cases. It is important in this process that the target have sufficiently high electrical conductivity. Also, the density of the target is important because it must maintain its structural integrity during the process. Furthermore, the surface cannot have large holes in the body which may result in virtual gas leaks in the system. Another potential source of trouble is large sealed pores which entrap undesirable gases or physically excluded impurities. Current fabrication techniques of the ceramic target include hot pressing, slip casting, isostatic pressing, and sintering. It is envisioned that sintering is the preferred process. Although the purity of a sintered target is not as high, a variety of shapes and sizes can be obtained with relatively low cost. Furthermore, the impurities may be beneficial by increasing the conductivity of the target.

The films of the present invention are useful for a variety of protective coatings which can include glass, plastic or metal substrates.

It has also been discovered during the course of this invention that plastic substrates are preferably treated in oxygen containing gas plasma prior to coating to obtain good adhesion.

Targets are generally cooled to avoid thermal damage and even melting or decohesion of the target because the system inputs a great deal of power into the target.

EXAMPLES

To compare the present invention to silicon carbide films prepared by sputtering in an atmosphere lacking hydrogen, sputtered silicon carbide coatings were prepared in two different atmospheres. Example 1 was performed in a low pressure argon environment. Examples 2-4 were run in a low pressure argon-hydrogen mixture. The total pressure of the system for all examples was $4.0 \times 10^{-3}$ Torr. The substrates consisted of glass and plastic. The percent transmission of the silicon carbide coatings was measured by a He-Ne laser and included the substrate, i.e., either the glass or plastic. Different thicknesses of the coating were prepared.

Throughout the examples, references will be made to coating SiC on plastic and glass substrates. However, it should be realized that the inventive process could be used in coating transparent silicon carbide films on other materials as well as glass and plastic.

TABLE 1

| Example | Ratio of $Ar/H_2$ in the Atmosphere | Substrate | Film Thickness | Percent Transmission* |
|---------|-------------------------------------|-----------|----------------|----------------------|
| 1 | 100/0 | Glass | 1 micron | 30% |
| 2 | 80/20 | Glass | 1 micron | 55% |
| 3 | 80/20 | Plastic | 0.5 microns | 60% |
| 4 | 80/20 | Glass | 0.5 microns | 65% |

*not corrected for reflection loss

Thus it is apparent that there has been provided in accordance with the invention a process for coating silicon carbide thin films that fully satisfies the objects, aims, and advantages set forth above, while the invention has been described in conjunction with specific embodiments thereof, it is evident that many alternatives, modifications, and variations will be apparent to those skilled in the art in light for the foregoing description. Accordingly, it is intended to embrace all such alternatives, modifications, and variations as fall within the spirit and broad scope of the appended claims.

We claim:

1. A process for forming a silicon carbide coating comprising DC-magnetron sputtering an electrically conductive substantially silicon carbide target in a reduced pressure consisting essentially atmosphere having greater than 5 percents partial pressure of hydrogen and an inert gas to form a substantially transparent film on a substrate.

2. The process of claim 1, wherein said hydrogen comprises greater than 10 percent of the partial pressure.

3. The process of claim 2, wherein said hydrogen comprises greater than 20 percent of the partial pressure.

4. The process of claim 1, wherein said substrate is glass.

5. The process of claim 1, wherein said substrate is plastic.

6. The process of claim 5, wherein said plastic is plasma treated prior to said sputtering.

7. The process of claim 1, wherein said inert gas is argon.

8. The process of claim 1, wherein said reduced pressure atmosphere is less than 0.01 torr.

9. The process of claim 1, wherein said target is sintered silicon carbide.